United States Patent [19]

Nave

[11] Patent Number: 4,849,685

[45] Date of Patent: Jul. 18, 1989

[54] MEASURING AND LIMITING EMI WITH A DIFFERENTIAL MODE REJECTION NETWORK

[76] Inventor: Mark J. Nave, 11833 93rd Ave. North, Seminole, Fla. 33542

[21] Appl. No.: 103,398

[22] Filed: Oct. 1, 1987

[51] Int. Cl.$^4$ ............................................. G01R 27/00
[52] U.S. Cl. ................................................. 324/57 N
[58] Field of Search ........................ 324/57 N; 333/12

[56] References Cited

U.S. PATENT DOCUMENTS 4,263,549  4/1981  Toppeto ........................... 324/57 N

OTHER PUBLICATIONS

Schneider, "Noise Scource . . . Model . . . Filter Design" 1983, Proceedings of Powercon 10, pp. 167–175.
Nave, "Prediction of Conducted Emissions . . . " 1986, IEEE Intl. Symposium on EMC.
Toppeto, "Test Method . . . " 1979, EMC Symposium, Rollerdam.

Primary Examiner—Reinhard J. Eisenzopf
Assistant Examiner—Walter E. Snow
Attorney, Agent, or Firm—Charles A. McClure

[57] ABSTRACT

Measurement of electromagnetic interference (EMI), especially conducted emissions from electrical equipment under test (EUT) to transmission lines powering the EUT; and then limiting such EMI. Differential mode (as distinguished from common mode) EMI conducted emissions are excluded temporarily from measurement by interposing a differential mode rejection network (DMRN) between the EUT and an EMI-sensitive receiver, and such common mode EMI is measured. A filter against such common mode conducted emissions is designed and is interposed between the EUT and the EMI receiver, and such differential mode EMI is then measured—with the DMRN removed. A filter against the differential mode conductive emissions is also designed and interposed between the EUT and the receiver, and the total conducted emissions are rechecked. The respective filters are combined into a composite filter for the EUT to prevent such EMI conductive emissions from entering power transmission lines.

14 Claims, 2 Drawing Sheets

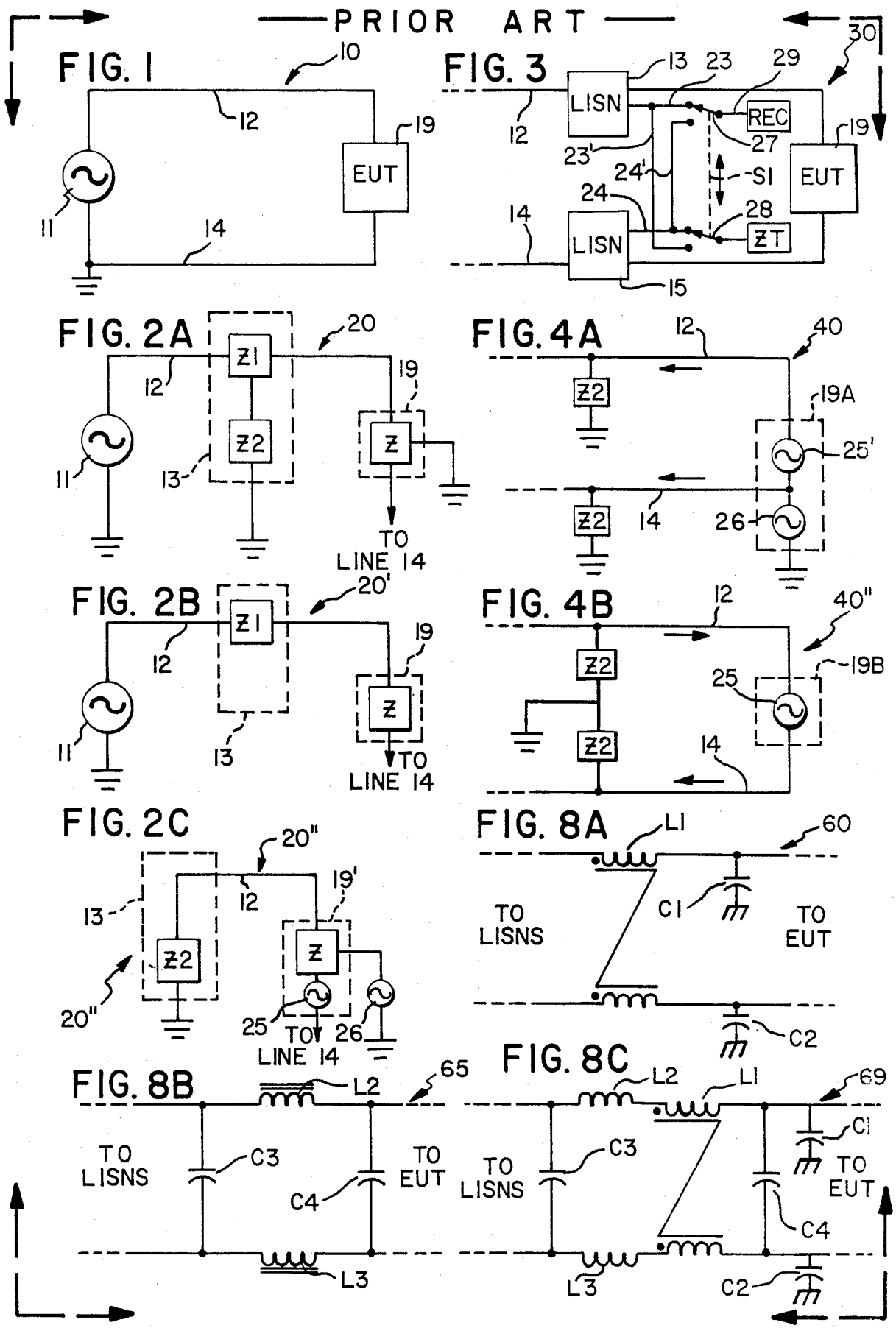

MEASURING AND LIMITING EMI WITH A DIFFERENTIAL MODE REJECTION NETWORK

FIELD OF THE INVENTION

This invention relates to measurement of electromagnetic interference (EMI), particularly emissions conducted to power transmission lines, and to limitation thereof by suitable means.

BACKGROUND OF THE INVENTION

Just as power transmission lines may convey transient surges or other voltage irregularities to electrical equipment intended to be powered therefrom, so equipment in line therewith may cause interference to be conducted back to an intervening electrical bus and to power lines themselves. Such conducted emissions (CE) may degrade computer performance, television picture quality, and the functioning of other electrical equipment powered from such lines. CE types of interference may be generated by computers, radio and TV receivers, motors, switching apparatus, and almost any electrical equipment with (or causing) a varying or noisy emission, whether as intended output or otherwise.

Filters are useful in reducing such interference, and it is conventional—in determining the desirability and effectiveness of filters—to measure conducted emissions with an instrument often called an EMI meter or spectrum analyzer. Such a meter has a logarithmic (dB) scale and is responsive via a voltage probe or current loop throughout a frequency range up to 30 MHz or higher.

Plotting the results of such measurements reveals whatever interference peaks and bands may exist, so that adequate filters can be designed and connected to (or installed in) the equipment under test (EUT) to limit such interference to a tolerable level at all frequencies. Designing such filters may fairly be viewed as principally an art rather than a science at this time.

Examples of persons who are both workers and writers in this field include Lon M. Schneider and Alphonse A. Toppetto, as well as the present inventor. Their published articles are of more interest than are EMI patents, so far as it known at this time. Noteworthy is the distinction they draw between "common mode" (CM) current conducted from phase and neutral lines to ground, and "differential mode" (DM) current conducted from a phase line to a neutral line. However, a need exists for methods and means of empirically determining with greater facility what filters are most suitable to combat both such types of conducted emissions. My invention is directed toward meeting that need.

SUMMARY OF THE INVENTION

In general, the objects of this invention are accomplished, in measuring electromagnetic interference (EMI) from equipment under test (EUT) powered from transmission lines including a neutral line and a phase line, by excluding differential mode (from common mode) EMI conducted emissions from equipment under test, by interposition of a differential mode rejection network, measuring such common mode EMI, filtering out such common mode EMI, and then measuring such differential mode EMI.

More particularly, such differential mode EMI is then filtered out also, and a composite filter—based upon both the common mode and the differential mode filters—is made and is interposed between the power transmission lines and the EUT.

A primary object of the present invention is to facilitate a desired reduction of electromagnetic interference from electrical equipment that in its operation is a generator of unintended EMI.

Another object of this invention is to systematize design of filters for limiting EMI to tolerable levels.

A further object of the invention is to provide a sequence of steps for measuring and limiting respective components of EMI.

Yet another object of this invention is to provide a device useful during the performance of such sequence of steps.

A still further object of the invention is a specific design of the electrical circuit of such a device.

Other objects of this invention, together with methods and means for accomplishing the various objects, will be apparent from the following description and from the accompanying drawings of a preferred embodiment thereof, which is presented here by way of example rather than limitation.

SUMMARY OF THE DRAWINGS

FIG. 1 is an electrical schematic diagram of interconnection of an A.C. power source to an electrical load, here equipment to be put under test (EUT) for electromagnetic interference (EMI);

FIG. 2A is a similar schematic view showing a line impedance stabilization network (LISN) interposed between the power source and the EUT—only one of the power transmission lines to the EUT being shown, for the sake of simplicity;

FIGS. 2B and 2C show, respectively, the equivalent electrical circuits of the same apparatus at conventional power frequency and at a much higher frequency characterized by EMI; and FIG. 3 is a schematic view of the same apparatus connected conventionally to an EMI receiver for measurement of its EMI.

FIGS. 4A and 4B are, respectively, schematic diagrams of "common mode" (CM) and "differential mode" (DM) conducted emissions (CE) from the EUT, especially part thereof acting to generate noise;

FIGS. 8A, 8B, and 8C are schematic representations of the EUT with, respectively, a CM filter, a DM filter, and a resulting or composite filter interposed between it and the power lines.

DETAILED DESCRIPTION

Figure 5:
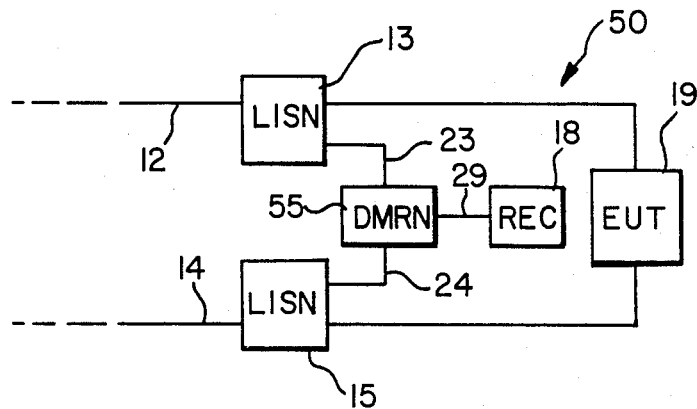
FIG. 5 is a schematic electrical diagram of the connection of the EUT and the EMI receiver as in FIG. 3, with the addition of a "differential mode rejection network" (DMRN) interposed between the LISNs and the receiver, according to this invention.

FIG. 1 shows, in conventional schematic manner, circuitry 10 wherein A.C. electrical power source 11 has ungrounded phase line 12 and grounded neutral line 14 leading to electrical load EUT 19. It will be understood, of course, that the same power lines have numerous other electrical loads (not shown) on them and that any one may generate EMI and propagate it as conducted emissions via the power transmission lines to other loads similarly connected. The objective is to provide filters—not shown here—between the load equipment and the power lines to limit conduction of such emissions from the equipment to the lines.

FIG. 2A shows in similar manner circuitry 20, wherein LISN 13 is interposed in phase line 12 between source 11 and EUT 19—and also between line 12 and ground. The LISN is intended to provide a stabilized impedance to emissions conducted from the EUT to the power lines, without interfering with the normal supply of power to the EUT. Grounded neutral line 14 (not shown here) is also provided with a like LISN. LISN 13 is made up of first impedance element Z1 (largely inductive) in series in the line and second impedance element Z2 (largely capacitive) between the first one and ground. Impedance Z of the EUT is also shown as connected to ground (parasitic) and to neutral line 14, whereupon it can be thought of as between the phase line and ground and/or as between both the phase and neutral lines and ground, as the case may be.

FIG. 2B shows effective circuitry 20' of the apparatus of FIG. 2A at power frequency, say 50 to 60 Hz, whereby inductive Z1 is low in impedance, and capacitive Z2 is so high in impedance as to be practically an open circuit—and, therefore, is omitted from view.

FIG. 2C shows effective circuitry 20" of the apparatus of Fig. 2A at high or noise frequency, whereby inductive Z1 is so high in impedance as to be practically an open circuit so is omitted from this view—along with the power source—and capacitive Z2 is very low in impedance. EMI source 25 (DM) is indicated in series between impedance element Z within the EUT (now designated 19') and neutral line 14, and EMI source 26 (CM) is indicated in series between the same impedance element and ground.

FIG. 3 shows schematically circuitry 30, wherein LISN 13 is interpoesd in phase line 12 and LISN 15 is interposed in neutral line 14 leading to EUT 19, as before, and wherein EMI receiver 18 and equivalent termination impedance ZT are so connectable via double-pole double-throw switch S1 to the respective LISNs. Here upper switch arm 27 connects the phase line LISN (via lead 23) to the EMI receiver (REC) lead 29, while lower switch arm 28 connects the neutral line LISN (via lead 24) to the ZT unnumbered lead. Such switch setting leaves unset alternative leads 23' and 24' of the LISNs, which interchange the LISN connections to REC and ZT. Such a conventional measuring arrangement fails to distinguish between "common mode" conducted emissions and "differential mode" conducted emissions, leaving filter design quite experimental and uncertain, even when the desirability of distinguishing between CM CE and DM CE is appreciated. The next views emphasize this.

FIG. 4A shows schematically effective circuitry 40' of CM CE at high or noise frequencies. Impedance elements Z2 between ground and respective phase and neutral power lines 12 and 14 receive currents from indicated source 25'—denoting whatever component(s) of the EUT act(s) as a source of such EMI. As CM CE currents (arrows) flow in the same direction at any given time in each of the power lines, source 26 is shown between both lines and ground. The EUT itself is marked 19A to distinguish it from its previous simpler representation, and load Z is omitted.

FIG. 4B shows similarly the effective circuitry 40" of DM CE at high or noise frequencies. Pair of impedance elements Z2 between respective phase and neutral power lines 12 and 14 and ground receive currents from source 25 of the EUT (now 19B) and shown between the respective power lines, as DM currents (arrows) circulate or flow in opposite directions in the two lines.

FIG. 5 shows schematically circuitry 50 for use in practicing the method of the present invention. This arrangement resembles FIG. 3 except that "differential mode rejection network" (DMRN) 55 is interposed between EMI receiver 18 and respective leads 23 and 24 to the LISNs. The utility of such DMRN will become apparent in the description of how and when to use it in measurements of EMI.

Figure 6:
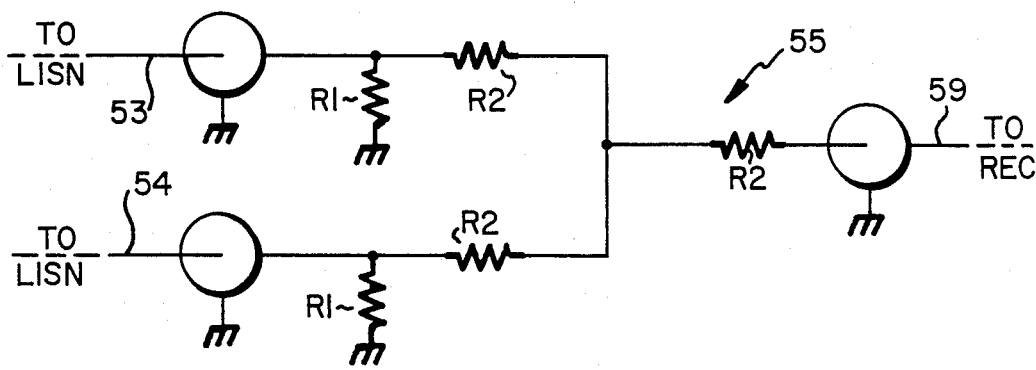
FIG. 6 is a schematic of such DMRN electrical circuitry.

FIG. 6 shows the circuit elements and interconnections of DMRN 5, which is shown with shielded leads—indicated by the surrounding grounded circles—namely, leads 53 and 54 to go to the respective LISN leads (23 and 25, not shown here) at the left and shielded lead 59 to the receiver (REC) lead (29, not shown here—at the right. Internally, the DMRN's left or LISN leads have respective resistors R1 connected thereto, with their other terminal grounded. Pair of resistors R2 are connected in series between the R1 LISN lead junctions, and a third R2 resistor connects from their mutual junction to the receiver lead.

In view of the standard (in the U.S.) termination requirement of 50 ohms for LISNs and for an EMI receiver, each R1 resistor has a value of 50 ohms, and each R2 resistor has a value of 16 ⅔ ohms. In European countries a higher LISN impedance (say, 100 or 150 ohms) is customary and can be scaled readily from the 50-ohm termination. Such DMRN is used in only a part of an EMI measuring process, but its use is critical to success of the measurement and to the effectiveness of consequent filter design, as will be seen from the following description.

Figure 7:
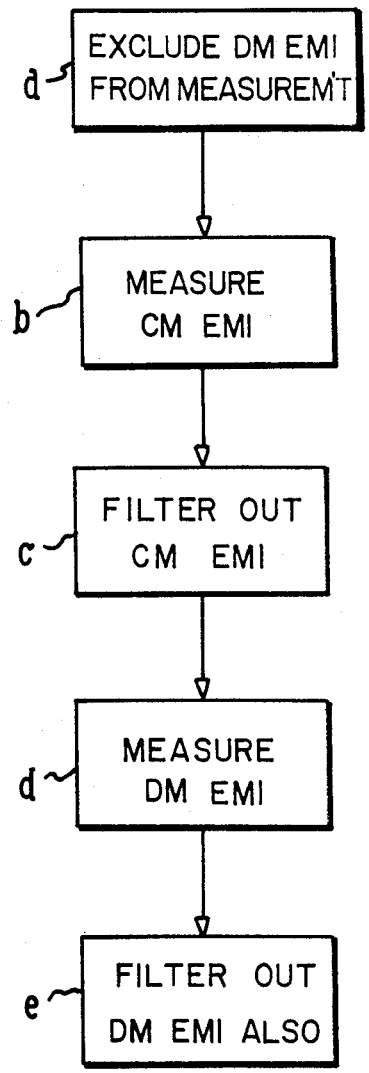
FIG. 7 is a block diagram of a method of limiting EMI from an EUT according to this invention, using a FIG. 6 DMRN as in FIG. 5.

FIG. 7 shows in block form successive steps of the present invention, characterizable succinctly as a preliminary step of excluding differential mode conductive emissions followed by steps of measuring the remaining or common mode conductive emissions, filtering such CM CE out, measuring the remaining (now unexcluded) differential mode conductive emissions, and filtering the same out.

These five steps may be rendered in greater detail by reciting also their related equipment aspects for any given EUT, as follows:

a. excluding from measurement EMI attributable to current flow between phase and neutral lines, as "differential mode" EMI;

b. measuring remaining EMI from the EUT, attributable to current flow from such neutral and phase lines to ground, as "common mode" EMI;

c. providing first filter means between the power lines and the EUT effective to diminish such common mode EMI to at most a preselected acceptable value;

d. measuring remaining EMI from the EUT, attributable in major part to undiminished differential mode EMI, and perhaps in minor part to such diminished common mode EMI; and e. providing second filter means between the power lines and the EUT effective to diminish such differential mode EMI to such an extent that the total EMI from the EUT is diminished to at most a preselected acceptable value.

FIGS. 8A, 8B, and 8C illustrate circuitry generally, whether in the prior art or according to this invention. More particularly, however, the values of the various circuit elements provided as taught here predictably provide adequate filtering of EMI, whereas prior art methodology at best only approximates such effective values. All readers should bear in mind continuously such dual aspect of these several views.

FIG. 8A shows schematically the apparatus upon interposition of CM filter 60 between the power lines and the EUT after step (b); FIG. 8B shows additionally interposed DM filter 65 after step (d); and FIG. 8C shows filter 69, a composite of 60 and 65 so interposed. Producing such a composite filter from two individual filters is well known and can be accomplished by persons of ordinary skill, once the composition of the respective filter components is known.

As shown in FIG. 8A, CM filter 60 has inductor L1 (with a high-permeability core) in the leads to the respective LISNs (out of view), and has a pair of capacitors C1 and C2 to ground from the respective leads to the EUT. In FIG. 8B, DM filter 65 has a pair of inductors L2 and L3 in the respective leads, and a pair of capacitors C3 and C4 interconnected between the respective leads and flanking both the inductors. Composite filter 69 in FIG. 8C combines the features of the filters of the two preceding views.

Composite filter means resulting from the combination of CM and DM filters should be very effective against both CM and DM CE. With the aid of this invention, the designing of such a filter is expedited as much as severalfold, as compared with the time that was expended in prior attempts. The end result also is superior to what has been accomplished heretofore. An EMI filter designer can function successfully with the aid of this teaching without the necessity of long training and experience and without a spark of artistic skill or genius such as would have been requisite in the absence of the present specification.

Notwithstanding the specificity of the foregoing description some modification may be made, as by adding, combining, deleting, or subdividing parts or steps, while retaining at least part of the advantages and benefits of the present invention—which itself is defined in the following claims.

The claimed invention:

1. In measuring electromagnetic interference (EMI) from electrical equipment under test (EUT) powered from an electrical power source via transmission lines, including a neutral line and a phase line, the improvement comprising the steps of
   interposing a "line impedance stabilization network" (LISN) between each such power line and the measuring location and then
      first segregating from measurement that portion of EMI from the EUT attributable to current flow between such phase and neutral lines, as "differential mode" EMI;
   next measuring that portion of EMI from the EUT attributable to current flow between such neutral and phase power lines to ground, attributable to "common mode" EMI; and
   then measuring the differential mode EMI after filtering out such previously measured common mode EMI;
   wherein the differential mode EMI is so segregated from the common mode EMI by interposing a "differential mode rejection network" (DMRN) between such LISNs and the measuring location during the measurement of common mode EMI, such DMRN comprising
      a pair of resistive circuit elements having a first value, connected in series between the respective lines and ground; and
      a trio of resistive circuit elements having a second value, a pair thereof being connected in series between the neutral line and the phase line, and such same pair being connected from their mutual junction to the EUT via the third of such circuit elements in series.

2. Measuring and limiting electromagnetic interference (EMI) from electrical equipment under test (EUT), which is powered from an electrical power source via transmission lines, including a neutral line and a phase line, each such line being provided with an appropriate line impedance stabilization network (LISN) between the line and the measuring location, comprising successive steps of
   (a) segregating from measurement such EMI from the EUT as is attributable to resistive impedance current flow between phase and neutral lines, being "differential mode" conducted emissions;
   (b) measuring, while such differential mode EMI is so segregated, EMI from the EUT attributable to current flow from such phase and neutral power lines to ground, being "common mode" conducted emissions;
   (c) filtering out such common mode EMI to an acceptable extent;
   (d) measuring remaining EMI from the EUT, attributable at least in major part to unsegregated differential mode conducted emissions;
   (e) and filtering out such differential mode conducted emissions to an acceptable extent.

3. EMI measuring and limiting method according to claim 2, including a resistive "differential mode rejection network" (DMRN) to so segregate the differential mode EMI in steps (a) and (b).

4. EMI measuring and limiting method according to claim 3, wherein each LISN has a certain resistive line stabilization impedance, and wherein the DMRN has a like resistive impedance.

5. EMI measuring and limiting method according to claim 4, wherein the DMRN includes a pair of 50-ohm resistors, connected respectively to ground from the neutral line and the phase line, and contains a trio of 16 ⅔-ohm resistors, two thereof being connected in series between the neutral and phase lines with their junction connected via the third resistor to the measuring location.

6. EMI measuring and limiting method according to claim 2, including
   providing first filter means effective to perform step (c), and
   providing second filter means effective to perform step (e).

7. EMI measuring and limiting method according to claim 6, including combining such first and second filter means into a similarly effective composite EMI filter means.

8. In apparatus including receiving means for measuring electromagnetic interference (EMI) conducted emissions from electrical equipment under test (EUT) powered by an electrical power source via transmission lines having line impedance stabilization networks (LISN) interposed between the respective lines and the EUT during measurement, the improvement comprising
   a differential mode rejection network (DMRN)

connected between the LISNs and the receiving means, effective to exclude differential mode conducted emissions from measurement, and having a given resistive impedance between each LISN and ground, and a like resistive impedance between the power lines and the receiving means.

9. Differential mode rejection network (DMRN) comprising a housing with resistive internal electrical circuitry and with three terminals to the exterior, two of such terminals being connectable, respectively, to LISNs connected between power transmission lines to equipment undergoing testing for electromagnetic interference (EMI), and the third of such terminals being connectable to an EMI receiver.

10. Differential mode rejection network (DMRN) comprising a housing with internal electrical circuitry and with three terminals to the exterior, two of such terminals being connectable, respectively, to LISNs connected between power transmission lines to equipment undergoing testing for electromagnetic interference (EMI), and the third of such terminals being connectable to an EMI receiver, a pair of like resistive impedance elements, connected respectively to the first pair of terminals and to ground, and a trio of resistive impedance elements like one another but different from the first elements, two of the latter resitive impedance elements connected in series across the first pair of terminals and with their junction connected in series to the EMI receiver lead via the third such resistive impedance element.

11. Differential mode rejection network (DMRN), useful in electromagnetic interference (EMI) measurement and filter design, comprising a trio of equal-valued Y-connected resistance elements for connection respectively in such use to a pair of LISNs and to an EMI receiver lead, and a pair of resistance elements equal-valued to one another and to the sum of the trio of resistance elements, for respective connection to the LISNs and to ground.

12. DMRN according to claim 11, located within shielding means with three terminals to the exterior, two thereof being respectively so connectable to LISNs, and the third thereof being so connectable to an EMI receiver lead.

13. DMRN according to claim 12, wherein the trio of equal-valued Y-connected resistance elements are connected respectively to the three terminals to the exterior, and the pair of resistance elements are connected respectively to the pair of LISN-connection terminals.

14. Method of using a DMRN of claim 11, including the steps of connecting the first two terminals respectively to a pair of LISNs connected from respective power transmission lines to electrical equipment energized thereby for EMI testing, and connecting the third terminal to an EMI receiver lead.

* * * * *